(12) United States Patent
Goto (10) Patent No.: US 10,630,240 B2
(45) Date of Patent: Apr. 21, 2020

(54) AMPLIFIER, AUDIO DEVICE AND CONTROL METHOD

(71) Applicant: YAMAHA CORPORATION, Hamamatsu-shi (JP)

(72) Inventor: Mitsutaka Goto, Hamamatsu (JP)

(73) Assignee: YAMAHA CORPORATION, Hamamatsu-Shi (JP)

( * ) Notice: Subject to any disclaimer, the term of this patent is extended or adjusted under 35 U.S.C. 154(b) by 2 days.

(21) Appl. No.: 16/116,243

(22) Filed: Aug. 29, 2018

(65) Prior Publication Data

US 2019/0074798 A1    Mar. 7, 2019

(30) Foreign Application Priority Data

Sep. 6, 2017  (JP) ................. 2017-170836

(51) Int. Cl.
| | | |
|---|---|---|
| H03F 1/02 | (2006.01) |
| G10K 11/36 | (2006.01) |
| G01R 19/165 | (2006.01) |
| H03F 3/20 | (2006.01) |
| H04R 3/12 | (2006.01) |
| H03F 3/181 | (2006.01) |
| H03F 3/72 | (2006.01) |
| H03F 3/68 | (2006.01) |
| H03F 1/52 | (2006.01) |
| H03G 3/00 | (2006.01) |
| H04R 27/00 | (2006.01) |

(52) U.S. Cl.
CPC ..... *H03F 1/0227* (2013.01); *G01R 19/16538* (2013.01); *G10K 11/36* (2013.01); *H03F 1/0222* (2013.01); *H03F 1/52* (2013.01); *H03F 3/181* (2013.01); *H03F 3/20* (2013.01); *H03F 3/68* (2013.01); *H03F 3/72* (2013.01); *H04R 3/12* (2013.01); *H03F 2200/321* (2013.01); *H03F 2203/7227* (2013.01); *H03G 3/004* (2013.01); *H04R 27/00* (2013.01); *H04R 2227/005* (2013.01)

(58) Field of Classification Search
CPC ........................... H03F 21/0227; H03F 1/0227
USPC ........................................ 330/136
See application file for complete search history.

(56) References Cited

U.S. PATENT DOCUMENTS

| | | | | |
|---|---|---|---|---|
| 7,268,621 B2* | 9/2007 | Kanoh | ...... | H03F 1/52 330/10 |
| 9,685,912 B2* | 6/2017 | Kim | ...... | H03F 1/0211 |
| 2005/0242880 A1* | 11/2005 | Domokos | ...... | H03F 1/0222 330/280 |

(Continued)

FOREIGN PATENT DOCUMENTS

JP    2015065502 A    4/2015

*Primary Examiner* — Patricia T Nguyen
(74) *Attorney, Agent, or Firm* — Rossi, Kimms & McDowell LLP (57) ABSTRACT

An amplifier includes a power amplifier that amplifies an input signal, a VI detection circuit that is connected to a rear stage of the power amplifier to detect power of an output signal of the power amplifier, and a controller that turns on the power amplifier when the input signal is inputted to the power amplifier, turns off the power amplifier when the input signal is not inputted to the power amplifier, and turns on the power amplifier when the VI detection circuit detects a voltage that exceeds a predetermined value when the power amplifier is in off state.

11 Claims, 5 Drawing Sheets

(56) References Cited

U.S. PATENT DOCUMENTS

| | | | |
|---|---|---|---|
| 2006/0203524 A1* | 9/2006 | Ohno | H02J 1/102 363/95 |
| 2007/0285163 A1* | 12/2007 | Kuehnel | H03F 3/217 330/251 |
| 2008/0139145 A1* | 6/2008 | Behzad | H03F 3/45183 455/127.1 |
| 2012/0021704 A1* | 1/2012 | Chan | H03G 3/3042 455/95 |
| 2015/0015339 A1* | 1/2015 | Gorbachov | H03F 1/0266 330/291 |
| 2018/0331659 A1* | 11/2018 | Khesbak | H03F 1/0227 |

* cited by examiner

| INPUT SIGNAL | VI DETECTION SIRCUIT (SPEAKER 2 TERMINAL VOLTAGE) | AMPLIFIER POWER SUPPLY |
|---|---|---|
| EXISTENT | — | ON |
| NONEXISTENT | NOT GREATER THAN PREDETERMINED VALUE | OFF |
| NONEXISTENT | GREATER THAN PREDETERMINED VALUE | ON |

AMPLIFIER, AUDIO DEVICE AND CONTROL METHOD

CROSS REFERENCE TO RELATED APPLICATIONS

This Nonprovisional application claims priority under 35 U.S.C. § 119(a) on Patent Applications No. 2017-170836 filed in Japan on Sep. 6, 2017 the entire contents of which are hereby incorporated by reference.

BACKGROUND OF THE INVENTION

1. Field of the Invention

Preferred embodiments of the present invention relate to an amplifier that is provided with a power amplifier amplifying an input signal, to an audio device, or to a method for controlling the amplifier.

2. Description of the Related Art

Japanese Unexamined Patent Application Publication (JP-A) No. 2015-065502 discloses an audio processing apparatus provided with a plurality of speakers that are installed in a first room, a second room and a third room, respectively.

A control portion of JP-A No. 2015-065502 connects a main output portion with an analog audio input terminal that is connected to a Zone 2 output portion 8 when the function of the main output portion for the first room is off, the function of the Zone 2 output portion 8 for the second room is on and the function of a Zone 3 output portion 9 for the third room is off; and cuts off supply of a power source voltage to the Zone 2 output portion 8 when a level of an audio signal that is detected by a DSP is less than a predetermined value.

This enables the audio processing apparatus of JP-A No. 2015-065502 to reduce power consumed by an AV amplifier (power amplifier) when the level of the audio signal of the main output portion is less than the predetermined value.

SUMMARY OF THE INVENTION

However, in a case where a plurality of speakers are installed closely between each other, cone paper of a speaker that is connected to an power amplifier whose power supply is in off state is caused to vibrate by sound energy that is output from operating speakers. This vibration, in turn, causes the speaker that is connected to the amplifier whose power supply is in off state to absorb the sound energy, and thus overall sound energy emitted by the plurality of speakers is reduced.

Further, the absorbed sound energy causes the speaker that is connected to the amplifier whose power supply is in off state to return power to the power amplifier's side. When the power returned to the power amplifier's side is large, there is also a risk of damaging elements.

Then, one aspect of the present invention provides an amplifier, an audio device, or a method for controlling the amplifier that is capable of reducing absorption of sound energy.

An amplifier according to one aspect of the present invention includes a power amplifier that amplifies an input signal, a VI detection circuit that is connected to a rear stage of the power amplifier to detect power of an output signal of the power amplifier, and a controller that turns on the power amplifier when the VI detection circuit detects a voltage that exceeds a predetermined value when the power amplifier is in off state.

Preferred embodiments of the present invention are capable of reducing absorption of sound energy.

The above and other elements, features, characteristics, and advantages of the present invention will become more apparent from the following detailed description of the preferred embodiments with reference to the attached drawings.

DETAILED DESCRIPTION

Figure 1:
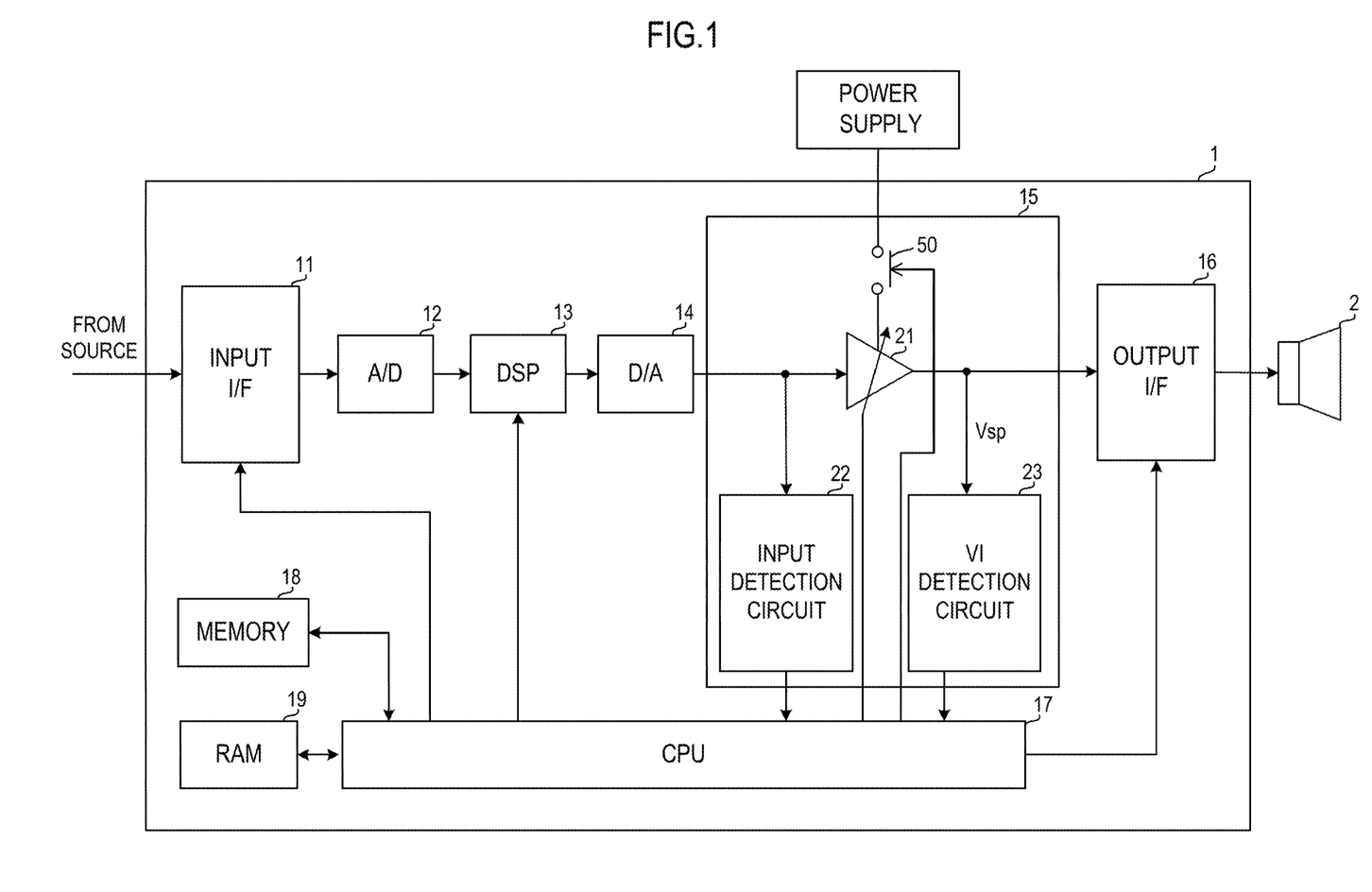
FIG. 1 is a block diagram showing a configuration of an amplifier.

FIG. 1 is a block diagram showing a configuration of an amplifier 1 according to one embodiment of the present invention. The amplifier 1 includes an input I/F 11, an A/D converter 12, a DSP 13, a D/A converter 14, an amplification circuit 15, an output I/F 16, a CPU 17, a MEMORY 18 and a RAM 19. The amplification circuit 15 consists of a power amplifier 21, an input detection circuit 22, a VI (voltage-current) detection circuit 23 and a switch 50.

The input I/F 11 performs inputting of an audio signal from a source such as audio mixer, etc. The input I/F 11 supplies the inputted audio signal to the A/D converter 12. The A/D converter 12 converts the inputted analog audio signal to a digital audio signal.

The DSP 13 corresponds to a signal processing circuit. The DSP 13, depending on a control by the CPU 17, applies a predetermined signal processing to the inputted digital audio signal. The DSP 13 performs a signal processing such as delaying, equalizing, compression, etc., for example.

The DSP 13 inputs the processed audio signal to the D/A converter 14. The D/A converter 14 converts the inputted digital audio signal to an analog audio signal. The D/A converter 14 inputs the signal-processed analog audio signal to the power amplifier 21. However, in the present invention, none of the A/D converter 12, the DSP 13 and the D/A converter 13 constitutes an essential element.

The power amplifier 21 amplifies the inputted analog audio signal, and inputs the amplified analog audio signal to the output I/F 16. A gain of the power amplifier 21 is specified by the CPU 17.

The power amplifier 21 is, for example, a Class D amplifier. The power amplifier 21 produces a PWM signal based on the inputted audio signal. The power amplifier 21, through performing switching of elements such as FET and/or the like based on the PWM signal, amplifies the PWM signal. The power amplifier 21 performs a processing of the amplified PWM signal with a low-pass filter to obtain an amplified audio signal.

The output I/F 16 has a terminal for output to speaker. The output I/F 16 outputs the amplified audio signal to the speaker 2 through the terminal for output to speaker. The speaker 2 emits sound based on the inputted audio signal.

The input detection circuit 22 is connected to a front stage of the power amplifier 21, and detects a level of the audio signal (input signal) that is inputted to the power amplifier 21. The CPU 17 determines whether or not there is an input signal, based on a result detected by the input detection circuit 22. For example, the CPU 17 determines that an input signal is existent when the level of the input signal that is detected by the input detection circuit 22 is not less than a predetermined value. The CPU 17 determines that the input signal is nonexistent when the level of the input signal that is detected by the input detection circuit 22 is less than the predetermined value.

The CPU 17 corresponds to a controller of the present invention. The CPU 17 reads out a program that is stored in the MEMORY 18, which is a storage medium, into the RAM 19; and performs a control of the amplifier 1 based on the program. For example, the CPU 17 turns on the power amplifier 21 when an input signal is detected by the input detection circuit 22, and turns off the power amplifier 21 when the input signal is not detected.

The CPU 17 controls supply of power to the power amplifier 21 by turning on or off the switch 50. When a power supply to the amplifier 1 is turned on, the switch 50 is turned on, and thereby the power amplifier 21 is turned on. When a state in which the input signal is not detected lasts for more than a predetermined time, the CPU 17 turns off the switch 50, thereby causing the power amplifier 21 to be turned off. This enables the CPU 17 to reduce useless power consumed by the power amplifier 21. Also, the CPU 17 causes the power amplifier 21 to be turned on by turning on the switch 50 when the input signal is detected. Further, the CPU 17 may turn off the power amplifier 21 immediately at the time when the input signal is not detected by the input detection circuit 22.

The VI detection circuit 23 is connected to a rear stage of the power amplifier 21, and detects a current value and a voltage value (power) of the audio signal (output signal) that is output from the power amplifier 21.

The CPU 17 may perform a control to decrease the gain of the power amplifier 21 when the power of the output signal that is detected by the VI detection circuit 23 is not less than a predetermined threshold value. This enables the CPU 17 to protect elements of the power amplifier 21.

Also, the VI detection circuit 23 detects a terminal voltage Vsp of the speaker 2. The CPU 17 causes the power amplifier 21 to be turned on by turning on the switch 50 when the terminal voltage Vsp of the speaker 2 that is detected by the VI detection circuit 23 exceeds a predetermined threshold value Vth when the power amplifier 21 is in off state with the switch 50 in off state.

The speaker 2, by supplying power to a voice coil depending on the inputted output signal, drives the coil through an electromagnetic interaction with a magnetic field, and thereby causes a cone paper to be displaced proportionally to the voltage (current). That is to say, motion of the cone paper of the speaker 2 is controlled by the power of the output signal. Therefore, the cone paper of the speaker 2 is under motion control by the operation of the power amplifier 21 even when vibrated under influences of sound emissions from other speakers and/or the like. In other words, as long as power to the power amplifier 21 is supplied, the displacement of the cone paper of the speaker 2 is under the control by the output voltage of the power amplifier 21.

However, when the power amplifier 21 is turned off, the cone paper of the speaker 2 becomes outside the motion control by the power amplifier 21. Therefore, the cone paper of the speaker 2 may vibrate under the influences of sound emissions from other speakers. When the cone paper of the speaker 2 vibrates in the audible band range, the speaker 2 absorbs sound energy in neighborhood area. When the speaker 2 absorbs the sound energy, sound pressures of other speakers emitting sounds drop, and thus overall sound energy emitted by a plurality of speakers is reduced.

Moreover, elements in the output stage of the power amplifier 21 are connected to the speaker 2 with low resistances. Therefore, there is a risk that a reverse electromotive force generated by the vibrating cone paper of the speaker 2 may damage the elements of the power amplifier 21. In particular, in the case of a PA (Public Address) System in a large space such as hall and/or theater, a large number of plurality of speakers are disposed next to each other. Also, volume of each speaker sound becomes very large. Therefore, it follows that vibrations of the plurality of speakers have big interactions between each other.

Thus, when the power amplifier 21 is in off state, the CPU 17 causes the power amplifier 21 to be turned on by turning on the switch 50 when the terminal voltage Vsp of the speaker 2 that is detected by the VI detection circuit 23 exceeds a predetermined threshold value Vth. When the power amplifier 21 is turned on, motion of the cone paper of the speaker 2 is controlled by the power of the output signal. This enables the amplifier 1 according to the embodiment to prevent the speaker 2 from absorbing the sound energy of the other speakers, thereby maintaining sound pressures of the other speakers. Also, the amplifier 1 according to the embodiment makes it possible to protect elements of the power amplifier 21 against being damaged by the reverse electromotive force arising from the vibrating cone paper of the speaker 2.

Figure 2:
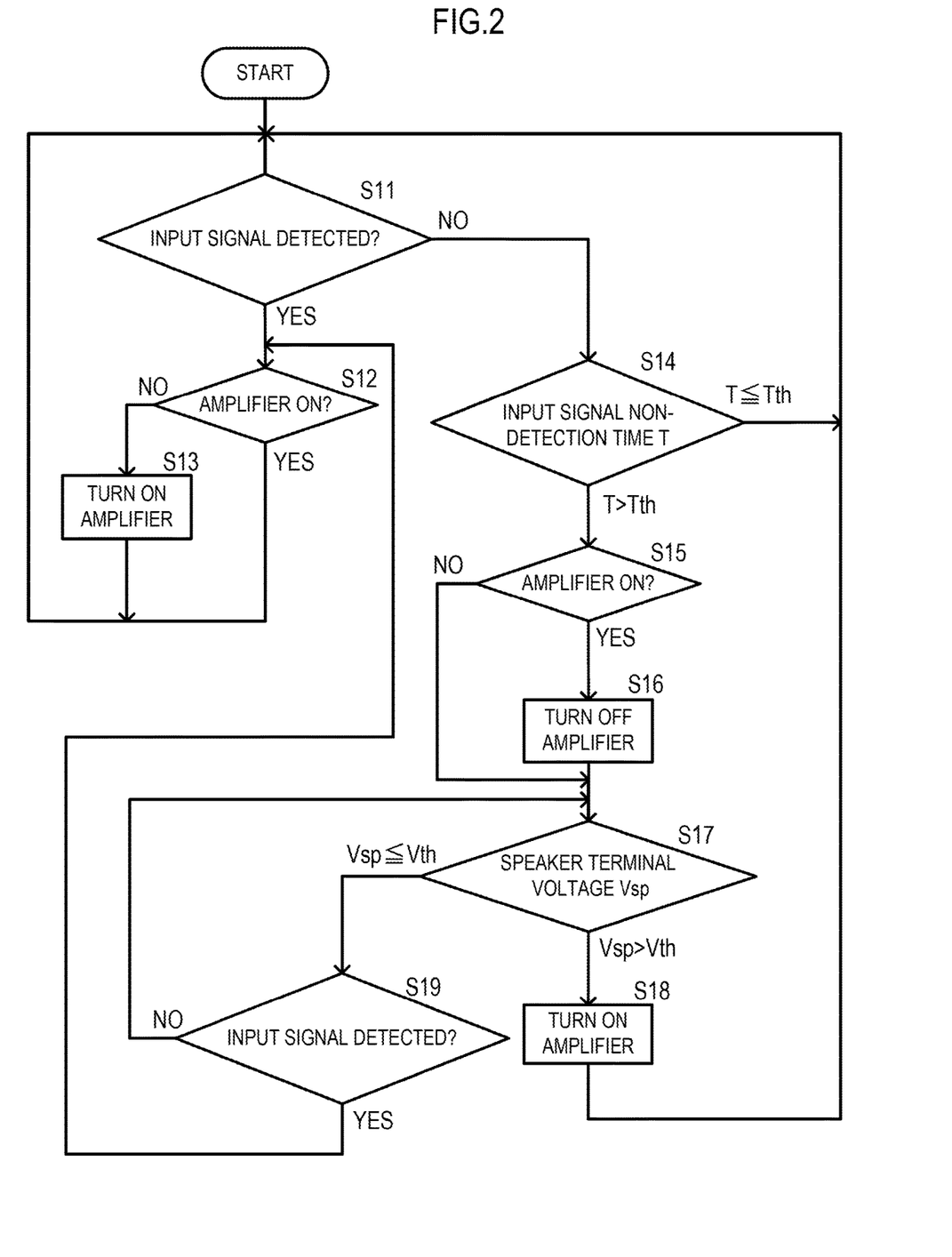
FIG. 2 is a flow chart showing an operation of the amplifier.

FIG. 2 is a flow chart showing an operation of the amplifier 1. When the power supply of the amplifier 1 is turned on and then the CPU 17 is booted up, the amplifier 1 performs the operation shown in the flow chart of FIG. 2. First, the CPU 17 determines whether or not an input signal is detected, based on a level of the input signal detected by the input detection circuit 22 (S11).

When detecting the input signal, the CPU 17 determines whether or not the power amplifier 21 is in on state (S12). When the power amplifier 21 is in off state, the CPU 17 causes the power amplifier 21 to be turned on by turning on the switch 50 (S13), and then returns to the determination of S11. When determining that the power amplifier 21 is in on state at the determination of S12, the CPU 17 returns to the determination of S11 without taking any action.

When not detecting an input signal at the determination of S11, the CPU 17 determines whether or not the state has continued for a predetermined time (S14). When a time T for which the input signal is not detected is not greater than a predetermined time Tth, the CPU 17 returns to the determination of S11 without taking any action. When the time T for which the input signal is not detected exceeds the predetermined time Tth, the CPU 17 determines whether or not the power amplifier 21 is in on state (S15). When the power amplifier 21 is in on state, the CPU 17 causes the power amplifier 21 to be turned off (S16). This enables the CPU 17 to reduce useless power consumed by the power amplifier 21. When the power amplifier 21 is in off state, the CPU 17 skips the process of S16.

Subsequently, the CPU 17 determines whether or not the terminal voltage Vsp of the speaker 2 that is detected by the VI detection circuit 23 exceeds the predetermined threshold value Vth (S17). When the terminal voltage Vsp of the speaker 2 that is detected by the VI detection circuit 23 exceeds the predetermined threshold value Vth, the CPU 17 causes the power amplifier 21 to be turned on by turning on the switch 50 (S18), and then returns to the determination of S11. When determining at the determination of S 17 that the terminal voltage Vsp of the speaker 2 that is detected by the VI detection circuit 23 is not greater than the predetermined threshold value Vth, the CPU 17 further determines whether or not the input signal is detected (S19). When determining that the input signal is nonexistent, the CPU 17 repeats the determination of S17. When determining that the input signal is existent, the CPU 17 returns to the determination of S12, and determines whether or not the power amplifier 21 is in on state.

Figure 3:
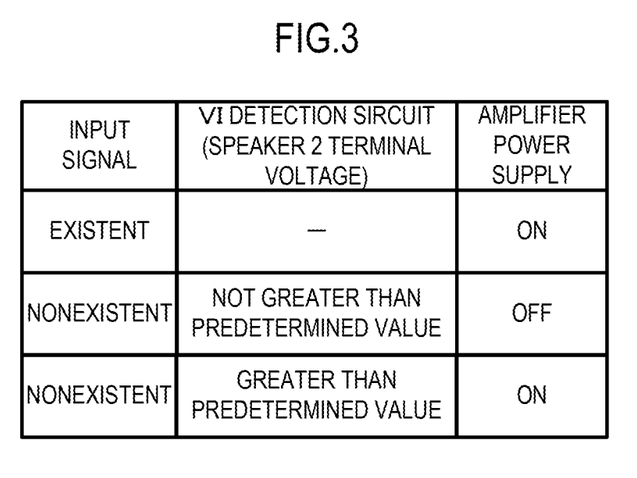
FIG. 3 is a list showing a relationship between an input signal, a terminal voltage Vsp of a speaker 2, and a power amplifier 21.

FIG. 3 is a list showing a relationship between the input signal, the terminal voltage Vsp of the speaker 2, and power supply to the power amplifier 21. As indicated in the uppermost line in the list of FIG. 3, when the input signal is detected by the input detection circuit 22, the power amplifier 21 is turned on. When the input signal is not detected by the input detection circuit 22, the power amplifier 21 is turned off. However, as indicated in the bottom line in the list of FIG. 3, even when the input signal is not detected by the input detection circuit 22 and the power amplifier 21 is in off state, the power amplifier 21 is turned on when the terminal voltage Vsp of the speaker 2 that is detected by the VI detection circuit 23 exceeds the predetermined threshold value.

In this manner, the amplifier 1 according to the embodiment makes it possible to prevent the speaker, whose power amplifier is in off state and which is thereby outside motion control, from vibrating caused by sound pressures from other speakers in operation and absorbing sound energy. Also, the amplifier 1 can protect elements of the power amplifier 21 from the reverse electromotive force arising from the absorbed sound energy.

Figure 4:
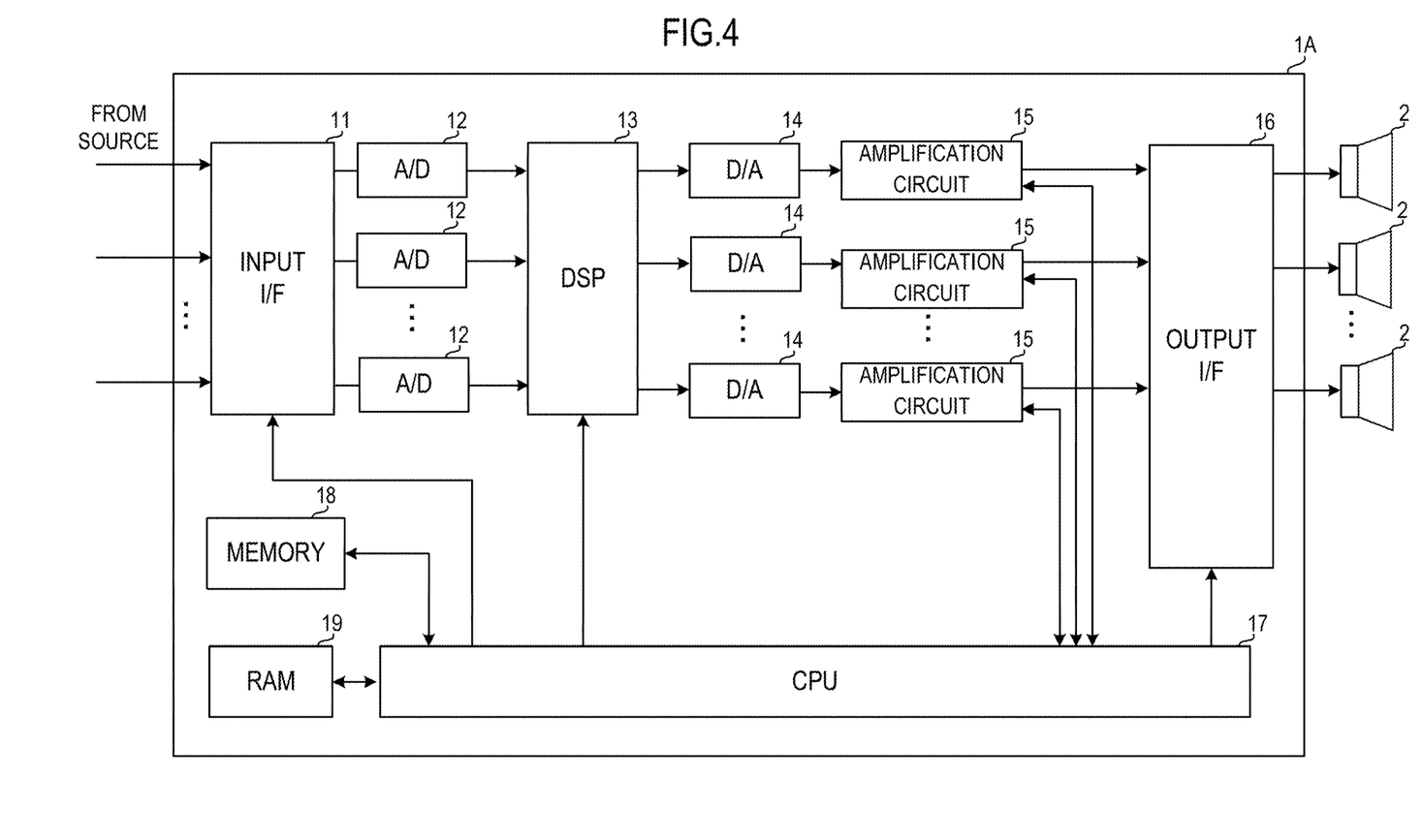
FIG. 4 is a block diagram showing a configuration of an amplifier connected to a plurality of speakers.

Subsequently, FIG. 4 is a block diagram showing a configuration of an amplifier 1A according to a modified embodiment 1. The same signs are used to constituents that are common with FIG. 1.

An input I/F 11 of the amplifier 1A performs inputting of audio signals for a plurality of channels. The amplifier 1A includes an A/D converter 12, a D/A converter 14 and the amplification circuit 15 for each channel. A DSP 13 applies each predetermined signal processing to an audio signal for each channel.

To an output I/F 16 a plurality of speakers 2 are connected. The output I/F 16 has terminals for output to a plurality of speakers. The output I/F 16, being connected with a speaker 2 for each channel, outputs an output signal for each channel.

The amplification circuit 15 for each channel includes, similarly to the one shown in FIG. 1, a power amplifier 21, an input detection circuit 22, a VI detection circuit 23 and a switch 50. A CPU 17 performs the operation shown in the flow chart of FIG. 2 for each channel.

This makes it possible for the amplifier 1A to not only reduce useless power consumed by each of the plurality of speakers 2 but also prevent speakers 2 not in operation from vibrating caused by sound pressures from speakers 2 for channels in operation and absorbing sound energy. Also, the amplifier 1A protects elements of the power amplifier 21 for each channel from the reverse electromotive force arising from the absorbed sound energy.

Figure 5:
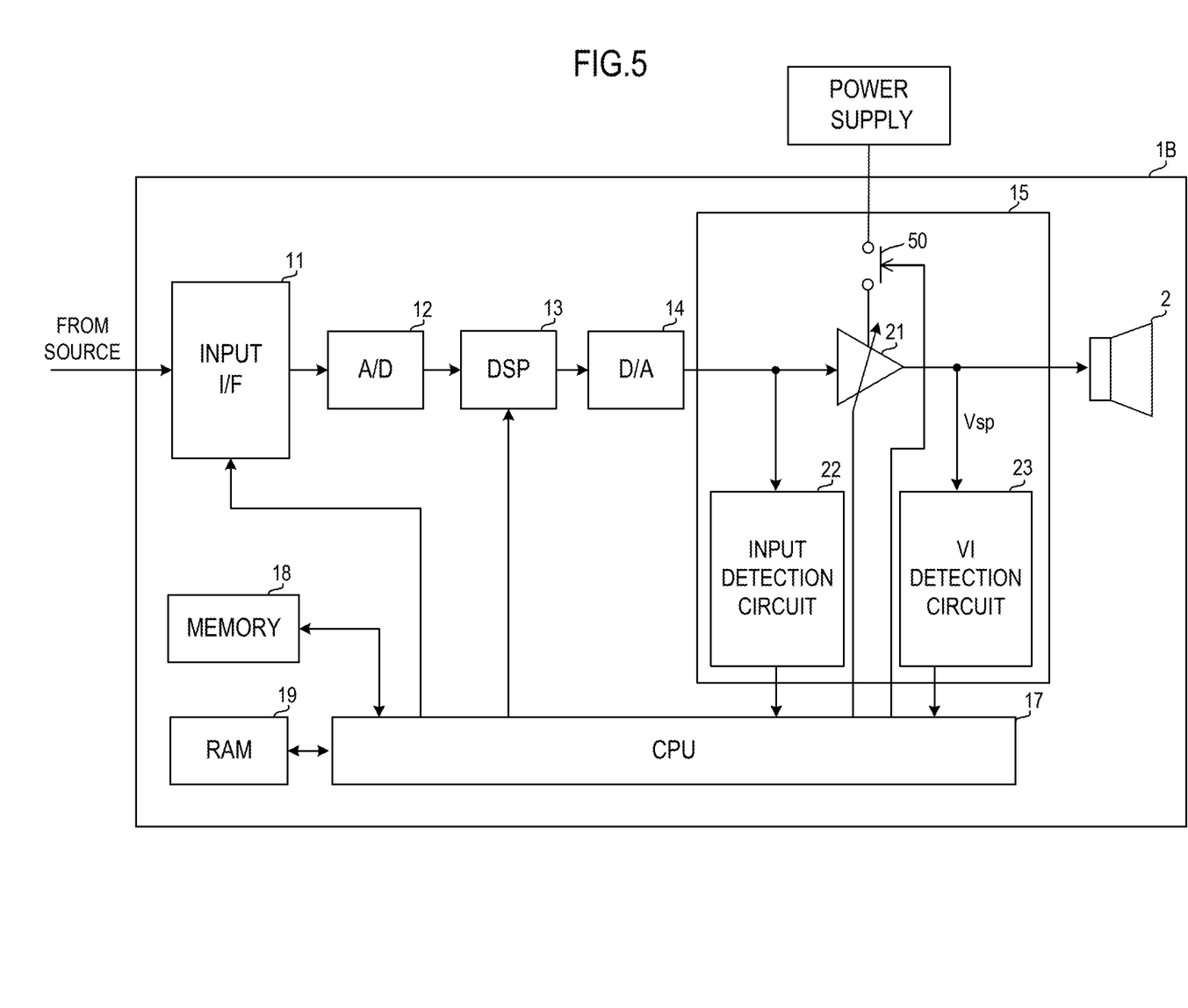
FIG. 5 is a block diagram showing a configuration of a powered speaker.

Subsequently, FIG. 5 is a block diagram showing a configuration of a powered speaker 1B into which an amplifier 1 and a speaker 2 are integrated. The powered speaker 1B is an example of an audio device provided with an amplifier 1 and a speaker 2. Other constituents are similar to those of the amplifier 1 shown in FIG. 1.

Also in the powered speaker 1B with a built-in amplification circuit 15, the CPU 17 causes the power amplifier 21 to be turned on by turning on the switch 50 when the terminal voltage Vsp of the speaker 2 that is detected by the VI detection circuit 23 exceeds a predetermined threshold value Vth when the power amplifier 21 is in off state.

Therefore, also in the powered speaker 1B with the built-in amplification circuit 15, it is made possible to not only reduce useless power consumption but also prevent the speaker from vibrating caused by sound pressures from other speakers in operation and absorbing sound energy. Further, in the powered speaker 1B as well, elements of the power amplifier 21 can be protected from the reverse electromotive force arising from the absorbed sound energy.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An amplifier comprising:
   a power amplifier that amplifies an input signal;
   a VI detection circuit connected to a rear stage of the power amplifier and that detects power of an output signal of the power amplifier; and
   a controller that, in a state where the power amplifier is OFF, turns ON the power amplifier when the VI detection circuit detects a voltage that exceeds a predetermined value.

2. The amplifier according to claim 1, further comprising:
   an input detection circuit connected to a front stage of the power amplifier and that detects a level of the input signal to the power amplifier,
   wherein the controller:
      based on the level detected by the input detection circuit, determines whether the input signal is detected;
      in a state where the power amplifier is OFF, turns ON the power amplifier when the input signal is detected; and
      in a state where the power amplifier is ON, turns OFF the power amplifier when the input signal is not detected.

3. The amplifier according to claim 2, wherein the controller, in a state where the power amplifier is ON, turns OFF the power amplifier when the input signal is not detected for a duration longer than a predetermined time.

4. The amplifier according to claim 1, further comprising a signal processing circuit that applies a predetermined signal processing to the input signal.

5. The amplifier according to claim 1, wherein the amplifier:
   is connectable to a plurality of speakers; and
   includes the power amplifier and the VI detection circuit for each of the plurality of speakers.

6. An audio device comprising:
   an amplifier comprising:
      a power amplifier that amplifies an input signal;

a VI detection circuit connected to a rear stage of the power amplifier and that detects power of an output signal of the power amplifier; and a controller that, in a state where the power amplifier is OFF, turns ON the power amplifier when the VI detection circuit detects a voltage exceeding a predetermined value; and a speaker that receives the output signal and emits sound.

7. A control method for an amplifier that amplifies an input signal, the method comprising:

detecting power of an output signal of the power amplifier from a rear stage of the amplifier; and controlling powering of the power amplifier, in a state where the power amplifier is OFF, by turning ON the power amplifier when the detecting of the power detects a voltage that exceeds a predetermined value.

8. The control method according to claim 7, further comprising:

detecting a level of the input signal to the power amplifier from a front stage of the power amplifier; and determining whether input signal is detected based on the detected level of the input signal, wherein the controlling of powering:

in a state where the power amplifier is OFF, turns ON the power amplifier when the input signal is detected; and in a state where the power amplifier if ON, turns OFF the power amplifier when the input signal is not detected.

9. The control method according to claim 8, wherein the controlling of the powering, in a state where the power amplifier is ON, turns OFF the power amplifier when the input signal is not detected for a duration longer than a predetermined time.

10. The control method according to claim 7, further comprising applying a predetermined signal processing to the input signal.

11. The control method according to claim 7, wherein:

the amplifier is connectable to a plurality of speakers, the amplifier includes the power amplifier for each of the plurality of speakers, and the controlling of the powering, in a state where the power amplifier is OFF, turns ON the power amplifier for each of the plurality of speakers when the detecting of the power detects the voltage that exceeds the predetermined value.

* * * * *